United States Patent [19]

Suganaga et al.

[11] Patent Number: 5,539,231
[45] Date of Patent: Jul. 23, 1996

[54] DYNAMIC RANDOM ACCESS MEMORY DEVICE HAVING REDUCED STEPPED PORTIONS

[75] Inventors: Toshifumi Suganaga; Eiichi Ishikawa, both of Hyogo, Japan

[73] Assignee: Mitsubishi Denki Kabushiki Kaisha, Tokyo, Japan

[21] Appl. No.: 397,341

[22] Filed: Mar. 2, 1995

[30] Foreign Application Priority Data

Jul. 11, 1994 [JP] Japan .................................. 6-158779

[51] Int. Cl.$^6$ ...................... H01L 27/148; H01L 29/768; H01L 27/108
[52] U.S. Cl. ........................ 257/306; 257/249; 257/296; 257/300
[58] Field of Search .................................. 257/213, 249, 257/288, 296, 300, 303, 306, 552, 734, 757, 758, 774

[56] References Cited

U.S. PATENT DOCUMENTS 5,012,309  4/1991  Nakayama .

FOREIGN PATENT DOCUMENTS

0488283A2  6/1992  European Pat. Off. .

OTHER PUBLICATIONS

"High–Density, Folded Dram Cell," IBM Technical Disclosure Bulletin, vol. 32, No. 9B, Feb. 1990, pp. 378–381.

Kitsukawa et al., "256–Mb DRAM Circuit Technologies for File Applications," IEEE Journal of Solid–State Circuits, vol. 28, No. 11, Nov. 1993, pp. 1105–1111.

*Primary Examiner*—Sara W. Crane
*Assistant Examiner*—Carl Whitehead, Jr.
*Attorney, Agent, or Firm*—Lowe, Price, LeBlanc & Becker

[57] ABSTRACT

A first conductive layer and a second conductive layer are formed apart from each other on a surface of a semiconductor substrate. A first contact hole for exposing a surface of first conductive layer is formed in an interlayer insulating film. A first interconnection layer is buried in first contact hole so as to be in contact with first conductive layer. The position of the surface of first interconnection layer is the same as or lower than the surface of interlayer insulating film. The surface of first interconnection layer is covered with an insulating film. A second contact hole for exposing a surface of second conductive layer is provided in interlayer insulating film. A second conductive layer is connected to second conductive layer through second contact hole.

4 Claims, 14 Drawing Sheets

DYNAMIC RANDOM ACCESS MEMORY DEVICE HAVING REDUCED STEPPED PORTIONS

BACKGROUND OF THE INVENTION

1. Field of the Invention

The present invention relates generally to semiconductor devices, and more particularly, to an improved semiconductor device permitting stepped portions of the device to be reduced. The present invention also relates to an improved semiconductor device permitting improvement of registration precision.

2. Description of the Background Art

In a semiconductor device with a multi-layer interconnection structure, the interconnection layers are formed on different insulating layers. These interconnections are connected to conductive layers formed on the semiconductor substrate through contact holes provided in the insulating layers.

Figure 15:
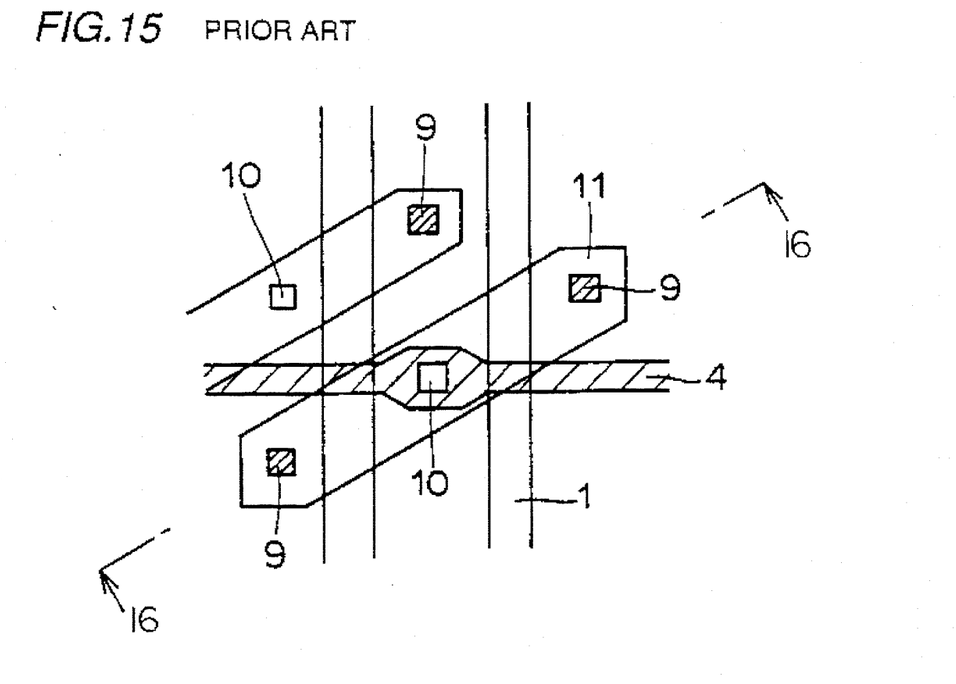
FIG. 15 is a plan view showing a conventional DRAM.
Figure 16:
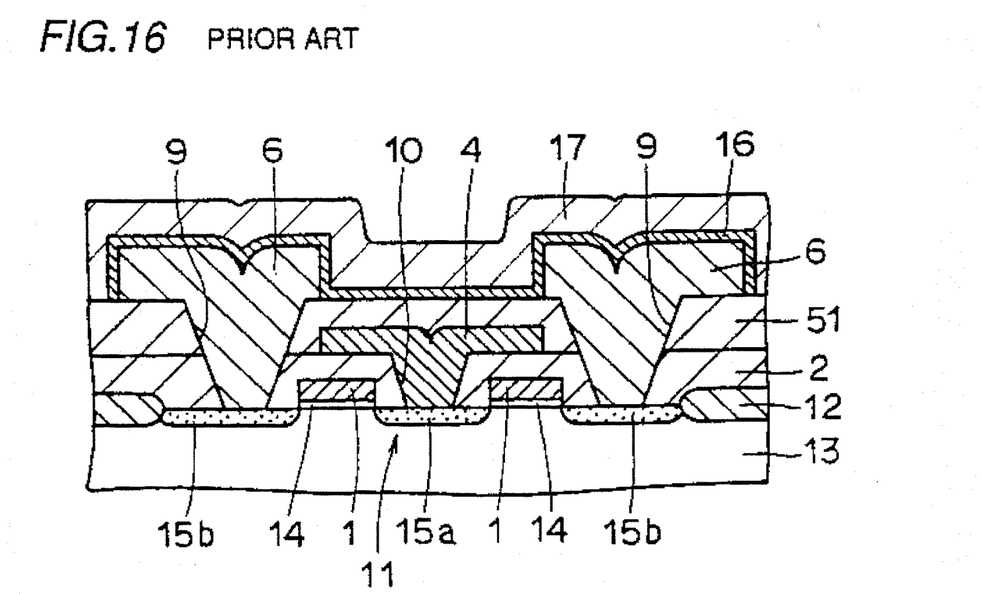
FIG. 16 is a cross sectional view taken along line A—A in FIG. 15.

FIG. 15 is a plan view showing an example of such a semiconductor device with a multi-layer interconnection structure, a conventional dynamic random access memory. FIG. 16 is a cross sectional view taken along line A—A in FIG. 15.

Referring to these figures, the dynamic random access memory (DRAM) includes a semiconductor substrate 13. A field oxide film 12 for electrically isolating an active region 11 from the other active regions is provided in a main surface of semiconductor substrate 13. A gate electrode 1 is provided on semiconductor substrate 13 with a gate insulating film 14 therebetween. A pair of source/drain layers 15a, 15b are provided in the main surface of semiconductor substrate 13 on both sides of gate electrode 1. A first interlayer insulating film 2 is provided on semiconductor substrate 13, covering gate electrode 1. A first contact hole 10 for exposing a surface of one source/drain layer 15a is provided in first interlayer insulating film 2. A buried bit interconnection layer 4 is provided on first interlayer insulating film 2 so as to be electrically connected to one source/drain layer 15a through first contact hole 10. The upper part of buried bit interconnection layer 4 extends horizontally on the surface of first interlayer insulating film 2. A second interlayer insulating film 51 is provided on first interlayer insulating film 2, covering buried bit interconnection layer 4. A second contact hole 9 for exposing a surface of the other source/drain layer 15b is provided, penetrating through first interlayer insulating film 2 and second interlayer insulating film 51. A storage node interconnection 6 is provided on second interlayer insulating film 51 so as to be connected to the other source/drain layer 15b through second contact hole 9. A dielectric film 16 covers a surface of storage node interconnection 6. A cell plate electrode 17 covers the surface of storage node interconnection 6 with dielectric film 16 therebetween.

A method of manufacturing the DRAM shown in FIG. 16 will be now described.

Figure 17:
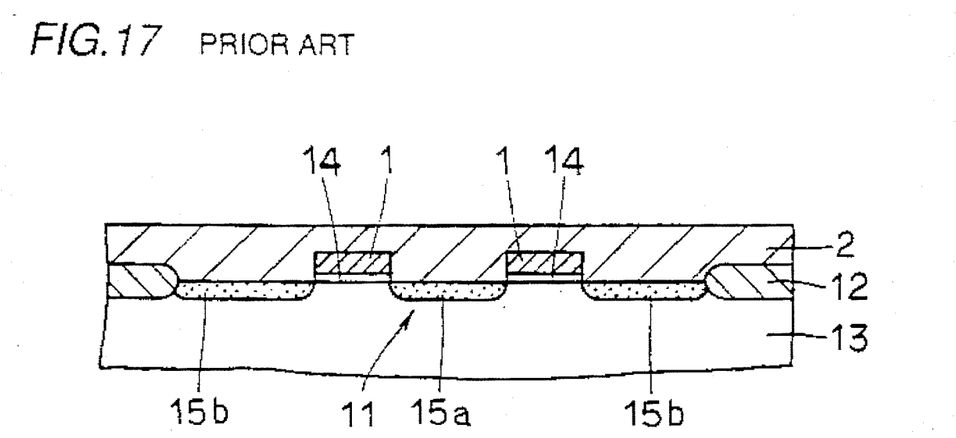
FIGS. 17 to 24 are cross sectional views showing first to eighth steps in the order of a method of manufacturing a conventional DRAM.

Referring to FIG. 17, field oxide film 12 for isolating active region 11 from the other active regions is formed in the main surface of semiconductor substrate 13. Gate electrode 1 is formed on semiconductor substrate 13 with gate insulating film 14 therebetween. Pair of source/drain layers 15a, 15b are formed in the main surface of semiconductor substrate 13 on both sides of gate electrode 1 by means of implanting an impurity. First interlayer insulating film 2 is

2 formed on semiconductor substrate 13 so as to cover gate electrode 1.

Figure 18:
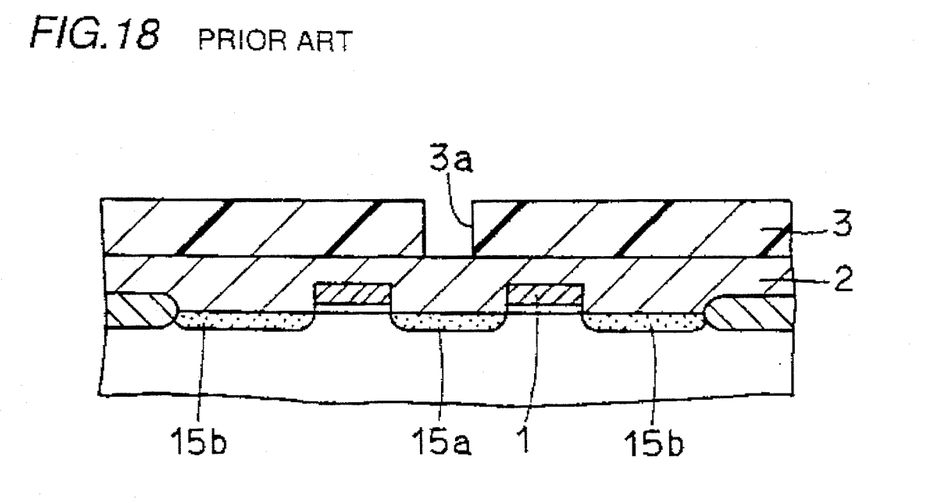

Referring to FIG. 18, photoresist 3 is formed on first interlayer insulating film 2. Photoresist 3 is patterned such that an opening 3a can be formed above one source/drain layer 15a.

Figure 19:
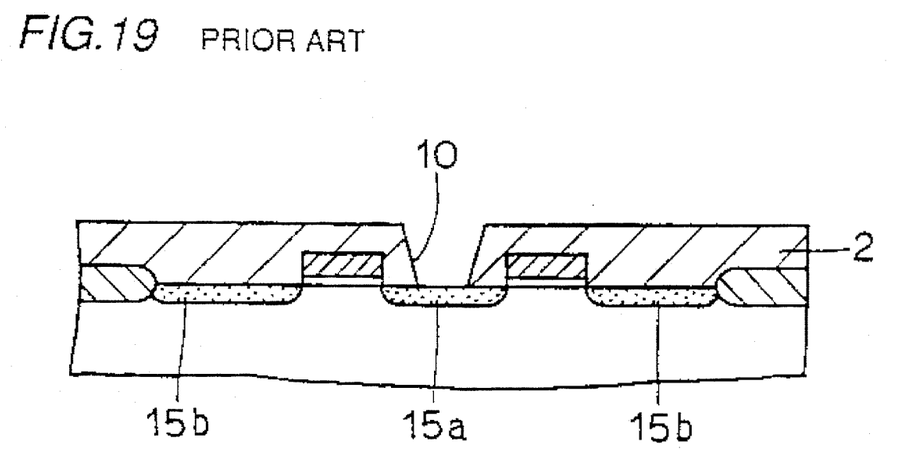

Referring to FIGS. 18 and 19, first interlayer insulating film 2 is etched using photoresist 3 as mask, and first contact hole 10 for exposing a surface of one source/drain layer 15a is in first interlayer insulating film 2. Photoresist 3 is removed.

Figure 20:
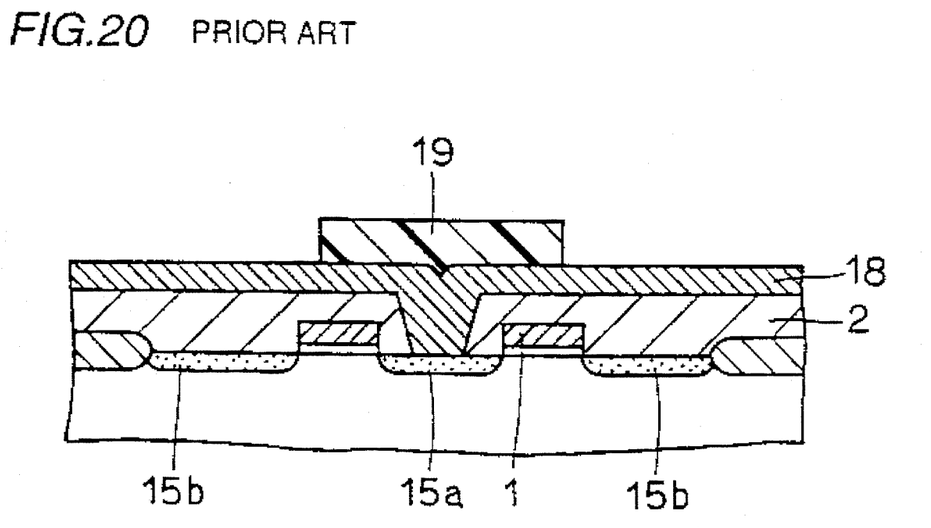

Referring to FIG. 20, a conductive layer 18 to form a buried bit interconnection to be electrically connected to one source/drain layer 15a through first contact hole 10 is formed. Photoresist 19 having a shape corresponding to the shape of the buried bit interconnection is formed on conductive layer 18.

Figure 21:
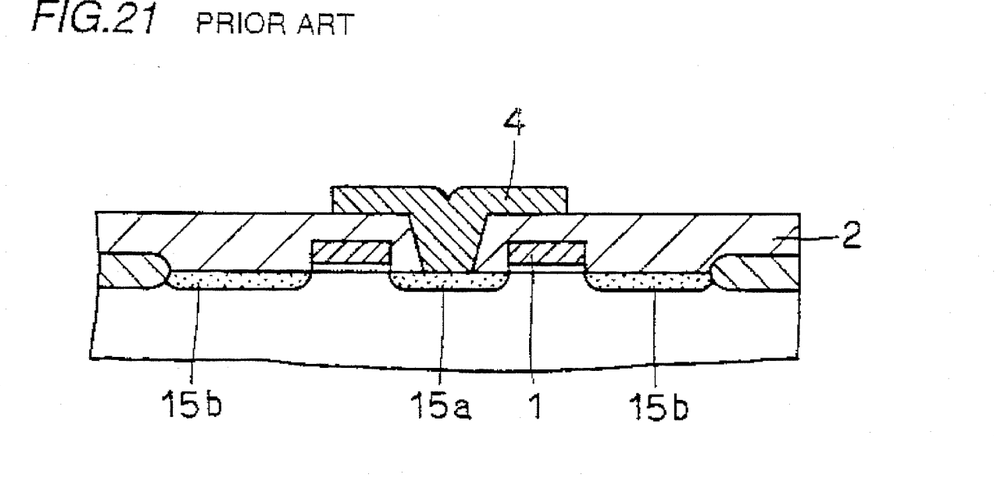
Figure 22:
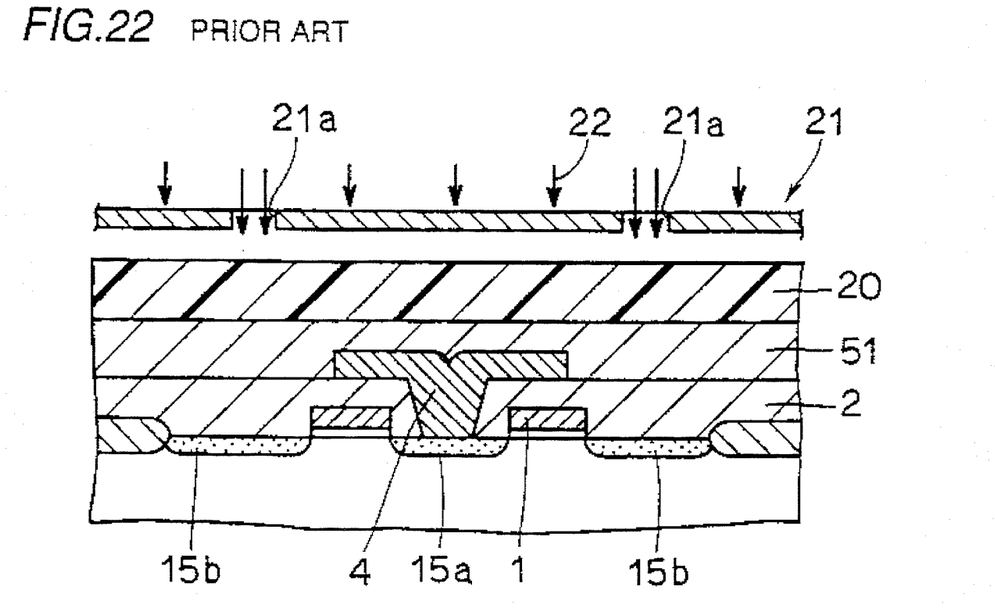
Figure 23:
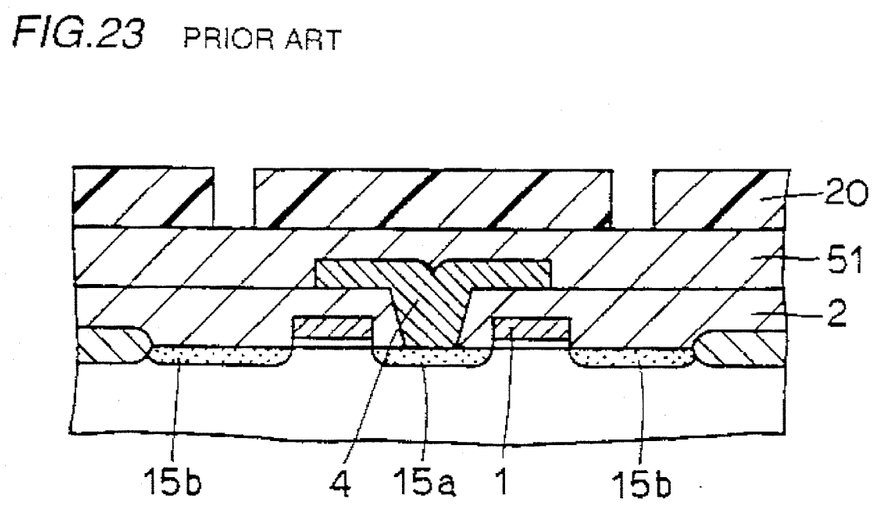

Referring to FIGS. 20 and 21, conductive layer 18 is patterned using photoresist 19 as mask, and buried bit interconnection layer 4 is formed. Photoresist 19 is removed. Referring to FIG. 22, second interlayer insulating film 51 is formed on first interlayer insulating film 2, covering buried bit interconnection layer 4. Positive photoresist 20 is formed on second interlayer insulating film 51. A photomask 21 is placed on photoresist 20. Photomask 21 has a portion 21a for passing light toward the other source/drain layer 15b. Using photomask 21, light 22 is selectively directed to photoresist 20. Referring to FIG. 23, the part of resist 20 exposed with light is removed away by means of development.

Figure 24:
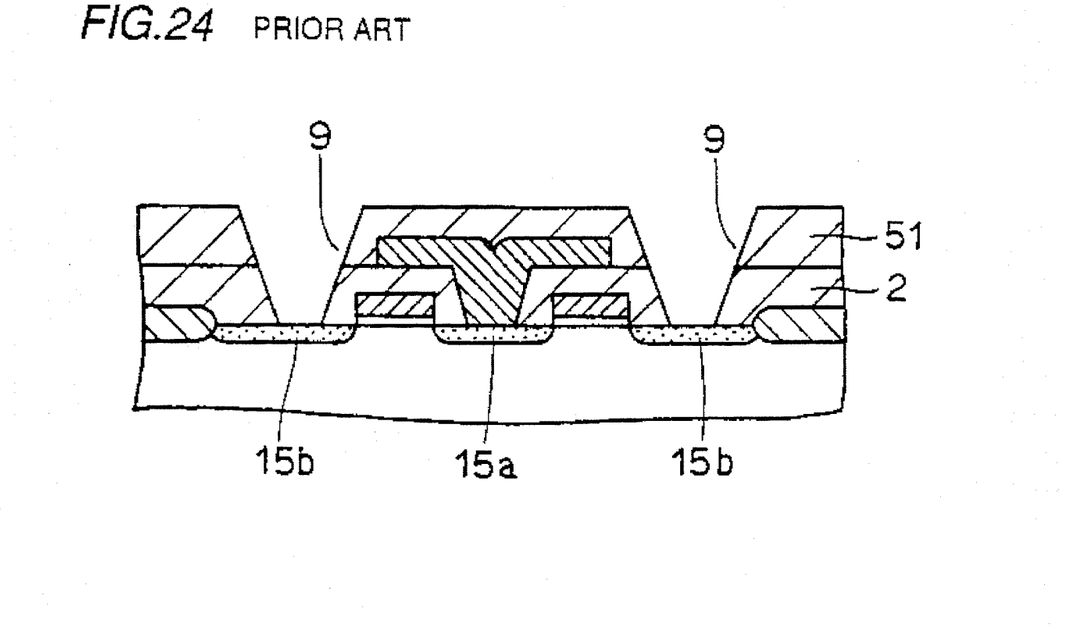

Referring to FIGS. 23 and 24, using photoresist 20 as mask, second interlayer insulating film 51 and first interlayer insulating film 2 are etched, and second contact hole 9 for exposing a surface of the other source/drain layer 15b is formed. Photoresist 20 is then removed away.

Figure 25:
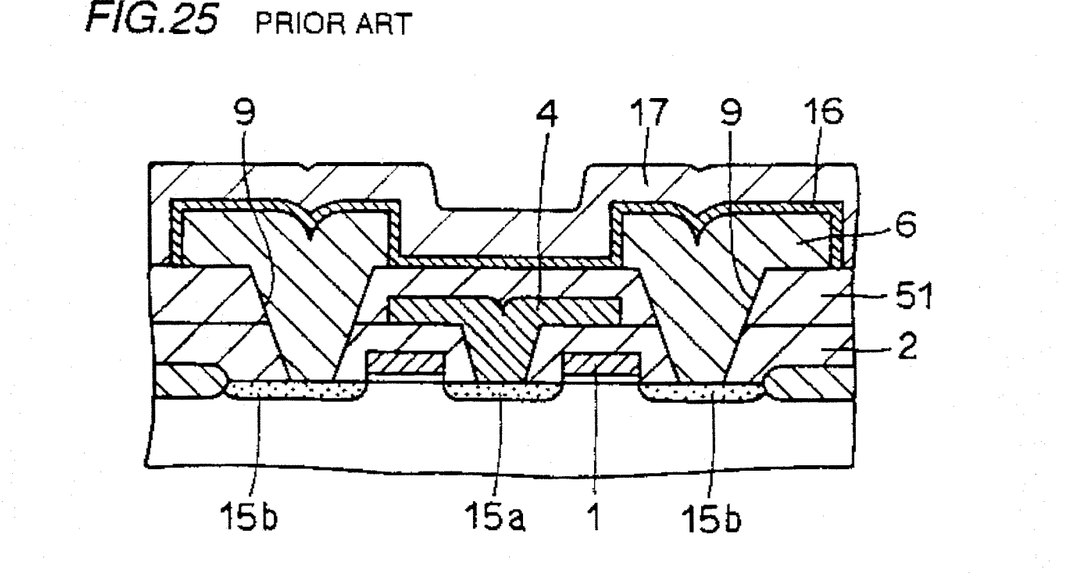
FIG. 25 is a first view for use in illustrating a problem associated with a method of manufacturing a conventional DRAM.

Referring to FIG. 25, storage node interconnection 6 is formed on second interlayer insulating film 51 so as to be connected to the other source/drain layer 15b through second contact hole 9. A surface of storage node interconnection 6 is covered with capacitor insulating film 16. Covering storage node interconnection 6 with cell plate electrode 17 with capacitor insulating film 16 therebetween completes the conventional DRAM.

Thus manufactured conventional semiconductor devices with multi-layer interconnection structure are encountered with the following disadvantages.

Figure 26:
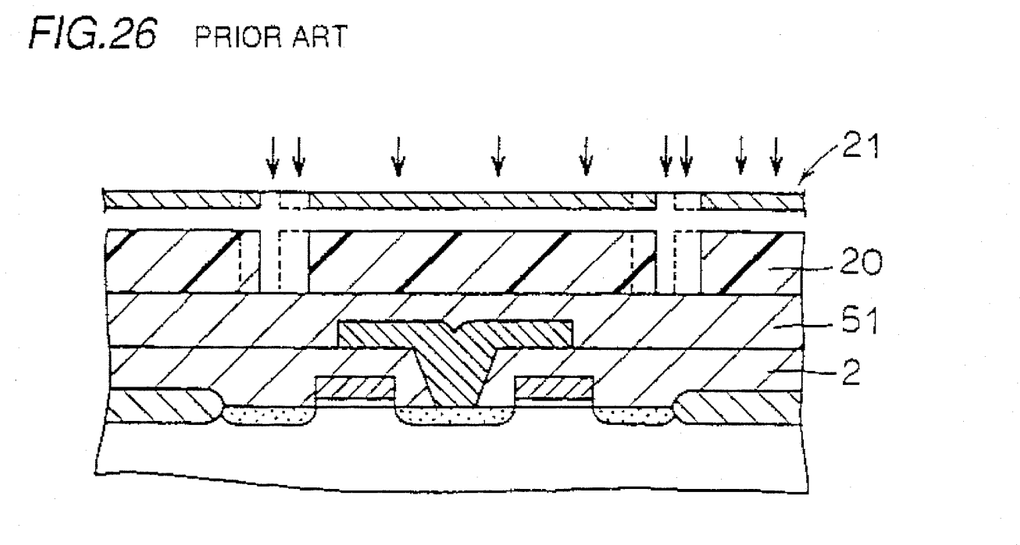
FIG. 26 is a second view for use in illustrating a problem associated with the method of manufacturing the conventional DRAM.

More specifically, referring to FIGS. 22 and 26 in comparison, there will be a problem if misregistration of photomask 21 occurs when forming a second contact hole.

Figure 27:
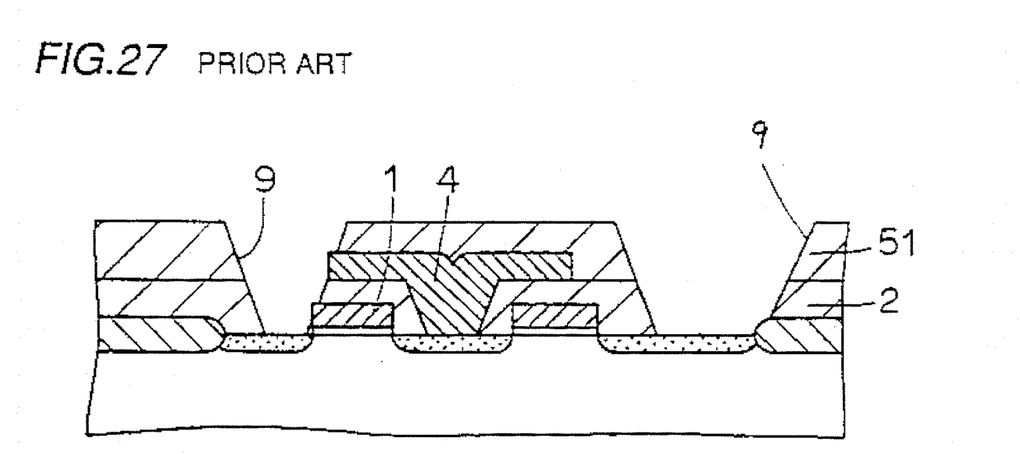
FIG. 27 is a third view for use in illustrating a problem associated with the method of manufacturing the conventional DRAM.
Figure 28:
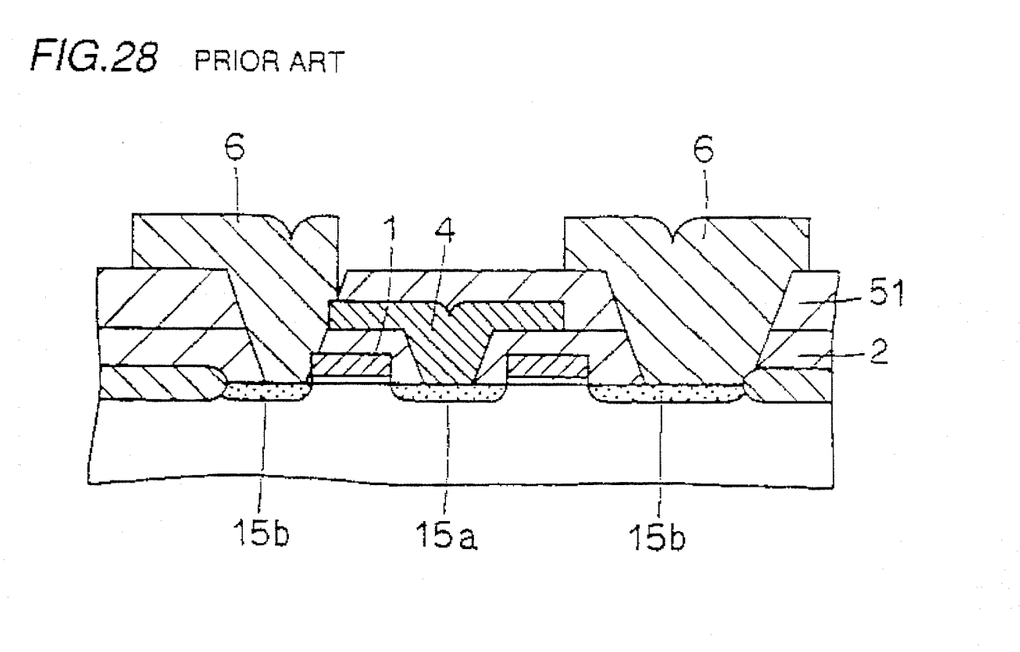
FIG. 28 is a view showing the structure in FIG. 27 with interconnection layers.

Misregistration of photomask 21 forms an opening shifted in photoresist 20. Etching first interlayer insulating film 2 and second interlayer insulating film 51 to form second contact hole 9 in this state exposes part of the surface of gate electrode 1 and part of the surface of buried bit interconnection layer 4 and partially removes field oxide film 12. Referring to FIGS. 27 and 28, if second contact hole 9 is formed shifted from the position as designed, and storage node interconnection 6 is connected to the other source/drain layer 15b, storage node interconnection 6 may be electrically connected to gate electrode 1 and buried bit interconnection layer 4 as well, or field oxide film 12 is partially removed, resulting in current leakage. The reliability of the DRAM thus decreases. The above-described method therefore strictly requires high registration precision.

Referring to FIG. 16, since buried bit interconnection layer 4 extends on first interlayer insulating film 2, stepped portions are generated, which makes difficult subsequent patterning of interconnections.

SUMMARY OF THE INVENTION

It is therefore an object of the invention to provide an improved semiconductor device permitting reduction of the thicknesses of interlayer insulating films and therefore reduction of stepped portions in the device.

Another object of the invention is to provide an improved dynamic random access memory permitting reduction of the thicknesses of interlayer insulating films and therefore reduction of stepped portions in the device.

Yet another object of the invention is to provide a method of manufacturing an improved semiconductor device permitting improvement of registration precision.

A still further object of the invention is to provide a method of manufacturing an improved semiconductor device permitting increase of margin in micro lithography.

An additional object of the invention is to provide a method of manufacturing an improved dynamic random access memory permitting improvement of registration precision.

A semiconductor device according to a first aspect of the present invention includes a semiconductor substrate. A first conductive layer and a second conductive layer are formed apart from each other on a surface of the semiconductor substrate. An interlayer insulating film is formed on the semiconductor substrate. A first contact hole for exposing a surface of the first conductive layer is provided in the interlayer insulating film. A first interconnection layer is buried in contact with the first conductive layer in the first contact hole. The position of the surface of the first interconnection layer is the same as the surface of the interlayer insulating film or lower. An insulating film covers the first interconnection layer. A second contact hole for exposing a surface of the second conductive layer is provided in the interlayer insulating film. A second interconnection layer is provided on the interlayer insulating film so as to be in contact with the second conductive layer through the second contact hole.

A semiconductor device according to a second aspect of the present invention includes a semiconductor substrate. A gate electrode is provided on the semiconductor substrate. A pair of source/drain layers are provided in a surface of the semiconductor substrate on both sides of the gate electrode. An interlayer insulating film is provided on the semiconductor substrate, covering the gate electrode. A first contact hole for exposing a surface of one of the source/drain layers is provided in the interlayer insulating film. A buried bit interconnection layer is buried in the first contact hole to be electrically connected to the one source/drain layer. The position of the surface of the buried bit line interconnection layer is the same as the position of the surface of the interlayer insulating film or lower. An insulating film covers the surface of the buried bit interconnection layer. A second contract hole for exposing a surface of the other source/drain layer is provided in the interlayer insulating film. A storage node interconnection is provided on the interlayer insulating film to be connected to the other source/drain layer. A capacitor insulating film covers a surface of the storage node electrode. A cell plate electrode covers the storage node interconnection with the capacitor insulating film therebetween.

In a method of manufacturing a semiconductor device according to a third aspect of the invention, a first conductive layer and a second conductive layer are formed apart from each other on a surface of a semiconductor substrate. An interlayer insulating film is formed on the semiconductor substrate. A first contact hole for exposing a surface of the first conductive layer and a second contact hole for exposing a surface of the second conductive layer are simultaneously formed in the interlayer insulating film. An insulator with a higher etching rate than the interlayer insulating film fills the first and second contact holes. The second contact hole is covered with resist, and the insulator filling the first contact hole is etched away. The resist is removed. A first interconnection layer to be connected to the first conductive layer through the first contact hole is formed on the semiconductor substrate. The first interconnection layer is etched back until the position of the surface is the same as the surface of the interlayer insulating film or lower, and a buried first interconnection layer buried in the first contact hole is thus formed. The surface of the buried first interconnection layer is covered with an insulating film. The insulator filling the second contact hole is removed. A second interconnection layer to be connected to the second conductive layer through the second contact hole is formed on the interlayer insulating film.

In the semiconductor device according to the first aspect of the invention, the position of the surface of the first interconnection layer is the same as the surface of the interlayer insulating film or lower, and therefore stepped portions in the device are reduced.

In the semiconductor device according to the second aspect of the invention, the position of the surface of the buried bit interconnection layer is the same as the position of the surface of the interlayer insulating film or lower, stepped portions in the dynamic random access memory can be reduced.

In the method of manufacturing the semiconductor device according to the third aspect of the invention, the first contact hole for exposing the surface of the first conductive layer and the second contact hole for exposing the surface of the second conductive layer are formed in the interlayer insulating film at a time, and therefore the positions of the first contact hole and the second contact hole will not be shifted from their originally designed positions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be now described.

Embodiment 1

Figure 1:
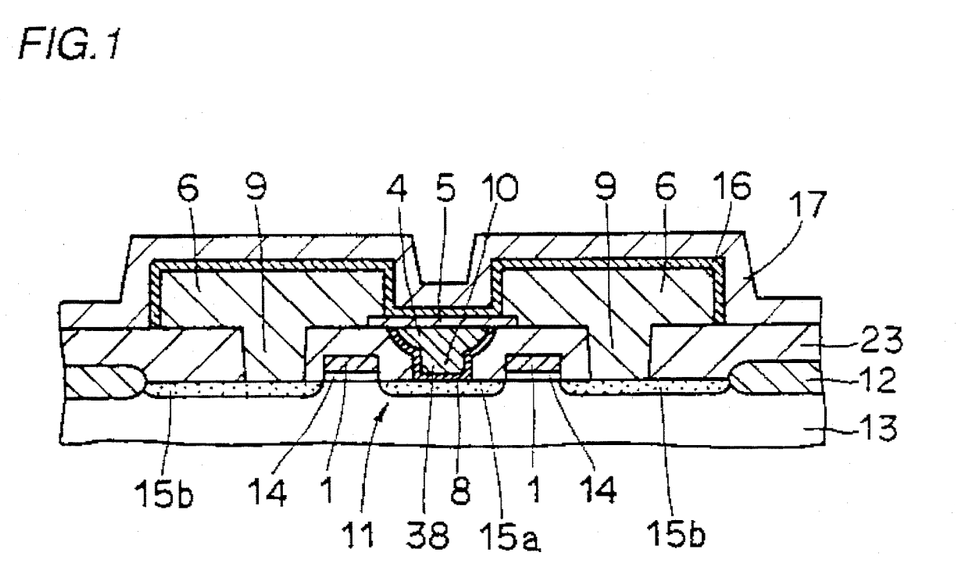
FIG. 1 is a cross sectional view showing a DRAM according to Embodiment 1.

FIG. 1 is a cross sectional view showing a DRAM according to Embodiment 1. Referring to FIG. 1, the DRAM according to Embodiment 1 includes a semiconductor substrate 13. A field oxide film 12 for isolating an active region 11 from the other active regions is provided in a surface of semiconductor substrate 13. A gate electrode 1 is formed on semiconductor substrate 13 with a gate insulating film 14 therebetween. Conductive layers, a pair of source/drain layers 15a, 15b are provided in the surface of semiconductor substrate 13 on both sides of gate electrode 1. An interlayer insulating film 23 is provided on semiconductor substrate 13, covering gate electrode 1. A contact hole 10 for exposing a surface of one source/drain layer 15a is provided in interlayer insulating film 23. A buried bit interconnection layer 4 is buried in first contact hole 10 to be in contact with one source/drain layer 15a. The position of the surface of buried bit interconnection layer 4 is the same as the surface of interlayer insulating film 23. The position of the surface of buried bit interconnection layer 4 may be lower than the surface of interlayer insulating film 23.

Buried bit interconnection layer 4 is formed of a TiN film 8 provided to cover the sidewall surface and bottom surface of first contact hole 10, and a polysilicon film or tungsten silicide film 38 provided on TiN film 8.

Buried bit interconnection layer 4 has a surface covered with an insulating film 5. The thickness of insulating film 5 is at least 0.05 µm. For a thickness of 0.05 µm or smaller, sufficient electrical isolation cannot be achieved. A second contact hole 9 for exposing a surface of the other source/drain layer 15b is provided in interlayer insulating film 23. A storage node interconnection 6 is provided on interlayer insulating film 23 so as to be connected to the other source/drain layer 15b through second contact hole 9. A dielectric film 16 covers a surface of storage node interconnection 6. A cell plate electrode 17 is provided on semiconductor substrate 13, covering storage node interconnection 6 with dielectric film 16 therebetween.

In the DRAM according to Embodiment 1, since the position of the surface of buried bit interconnection layer 4 is the same as or lower than the position of the surface of interlayer insulating film 23, stepped portions in the device are reduced.

A method of manufacturing the DRAM shown in FIG. 1 will be now described.

Figure 2:
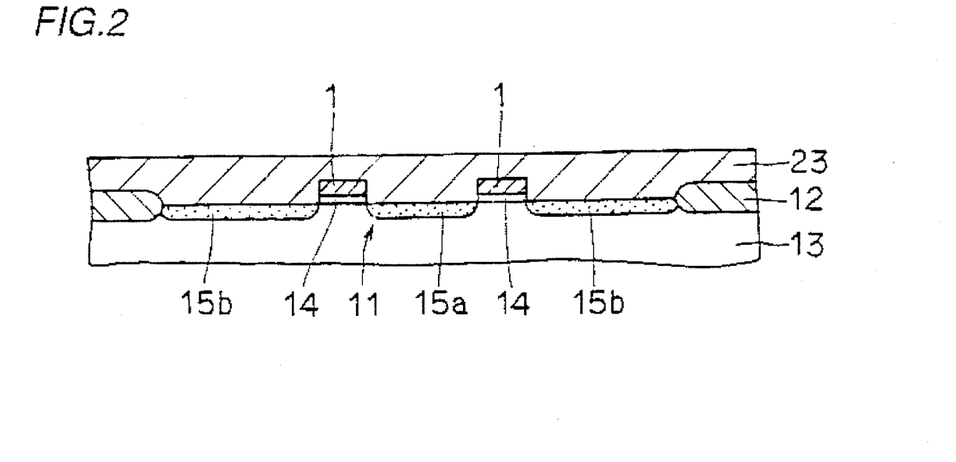
FIGS. 2 to 13 are cross sectional views showing first to twelfth steps in the order of a method of manufacturing the DRAM according to Embodiment 1.

Referring to FIG. 2, field oxide film 12 for isolating active region 11 from the other active regions is formed on the surface of semiconductor substrate 13. Gate electrode 1 is formed on semiconductor substrate 13 with gate insulating film 14 therebetween. Pair of source/drain layers 15a, 15b are formed in the surface of semiconductor substrate 13 on both sides of gate electrode 1. Interlayer insulating film 23 is formed on semiconductor substrate 13, covering gate electrode 1.

Figure 3:
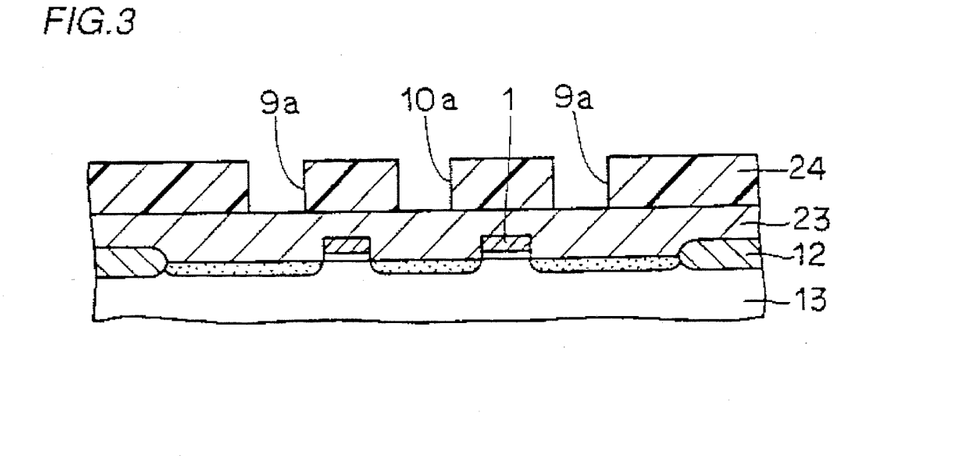

Referring to FIG. 3, photoresist 24 is formed on interlayer insulating film 23. Openings 9a, 10a are formed in photoresist 24 above one source/drain layer 15a and above the other source/drain layer 15b.

Figure 4:
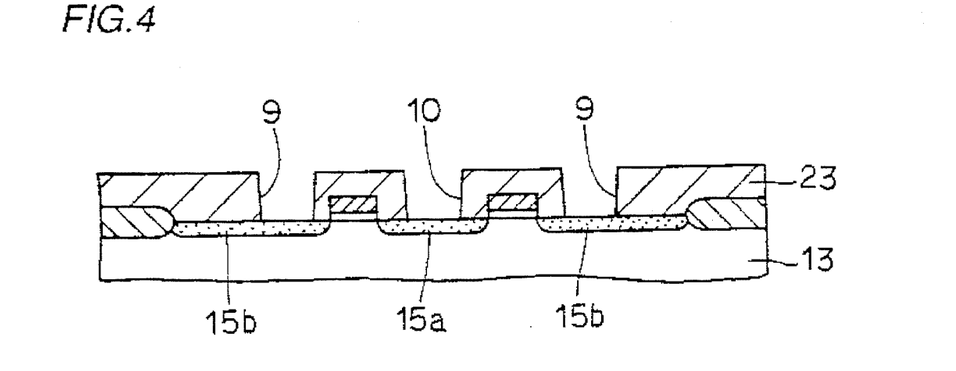

Referring to FIGS. 3 and 4, using photoresist 24 as mask, interlayer insulating film 23 is etched, in order to form at a time first contact hole 10 for exposing a surface of one source/drain layer 15a and second contact hole 9 for exposing a surface of the other source/drain layer 15b. Resist 24 is then removed away.

Figure 5:
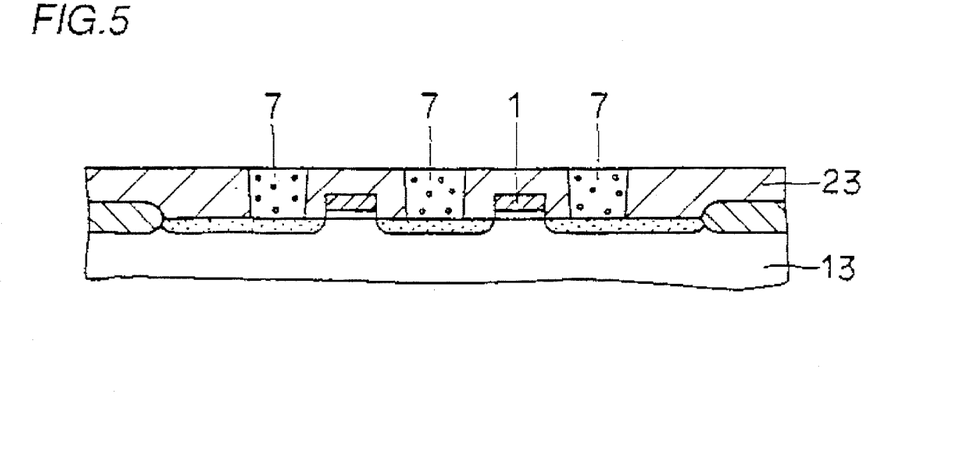

Referring to FIG. 5, an insulating film with a higher etching rate than interlayer insulating film 23 such as a spin-coatable coating oxide film (spin on glass etc.) 7 is formed on semiconductor substrate 13 to fill first contact hole 10 and second contact hole 9. Then, insulating film 7 is etched back until the position of the surface of insulating film 7 is lower than the position of the surface of interlayer insulating film 23.

Figure 6:
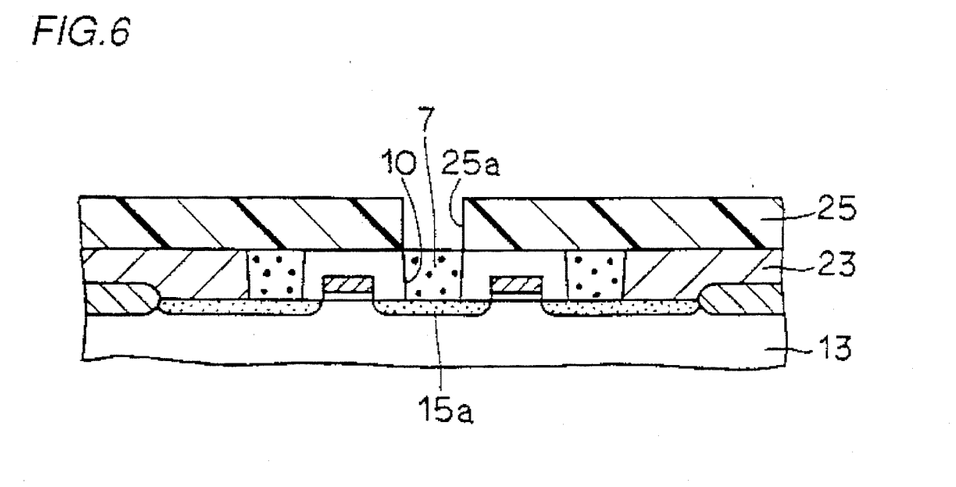

Referring to FIG. 6, photoresist 25 is formed on interlayer insulating film 23. The portion of photoresist 25 above first contact hole 10 is patterned to form opening 25a.

Figure 7:
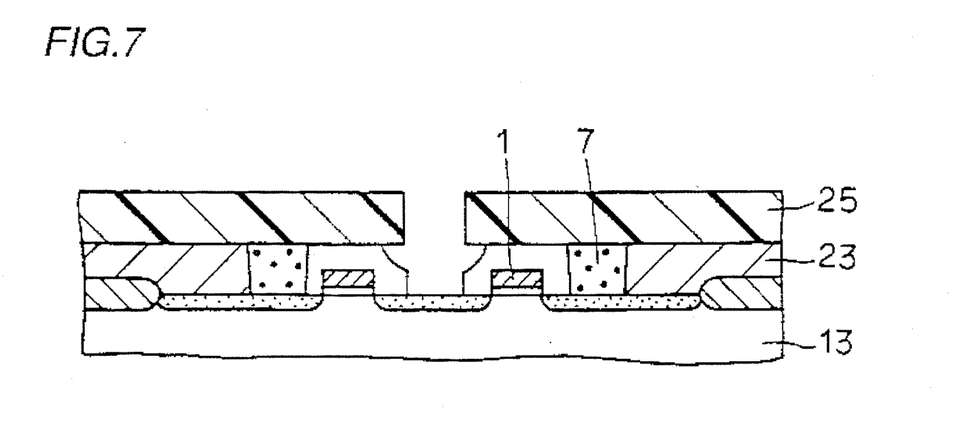

Referring to FIGS. 6 and 7, using photoresist 25 as mask, insulating film 7 is etched away by means of anisotropic or isotropic etching or both.

Figure 8:
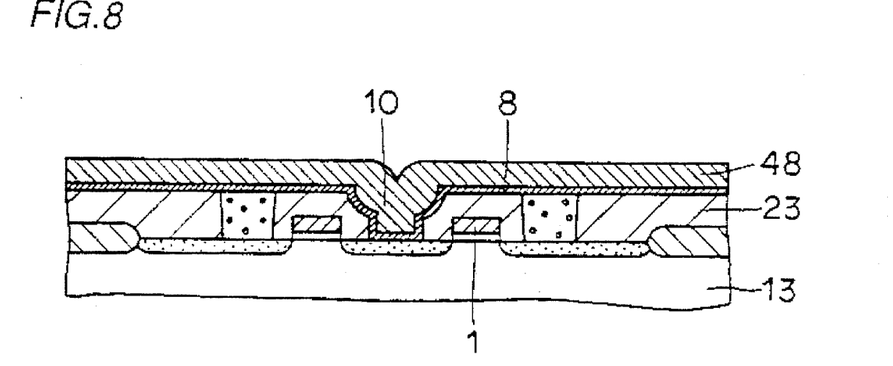

Referring to FIG. 8, TiN is sputtered by means of collimation sputtering to form TiN film 8 on interlayer insulating film 23 so as to cover the sidewall surface and bottom surface of first contact hole 10. Then, a polysilicon film or tungsten silicide film 48 is formed on TiN film 8 by means of chemical vapor deposition so as to fill first contact hole 10.

Figure 9:
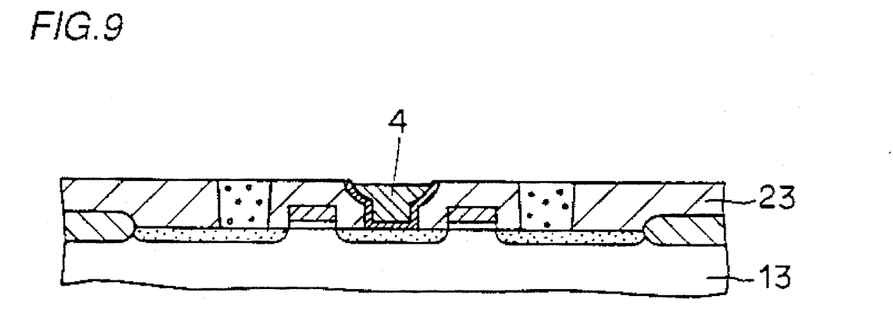

Referring to FIGS. 8 and 9, polysilicon film or tungsten silicide film 48 and TiN film 8 are etched back or polished by means of chemical/mechanical polishing method, and a buried bit interconnection layer 4 buried in first contact hole 10 is formed. The etching back or polishing by CMP or the like is conducted under such a condition that the position of the surface of buried bit interconnection layer 4 is the same as the surface of interlayer insulating film 23 or lower.

Figure 10:
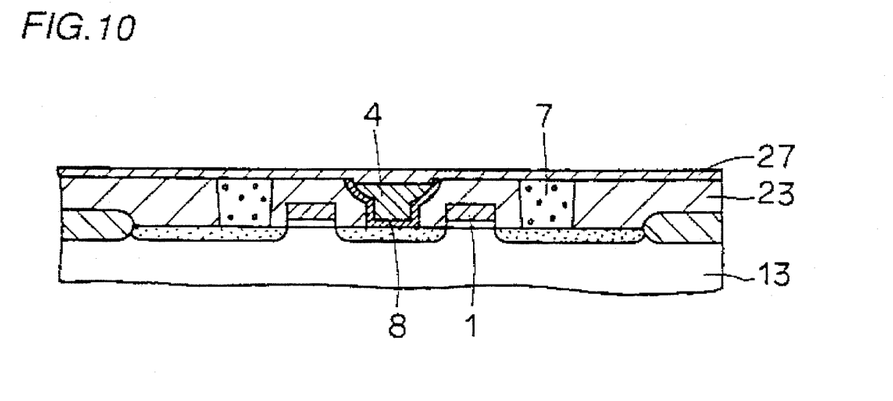

Referring to FIG. 10, a second insulating film 27 is formed on the semiconductor substrate so as to be in contact with the surface of buried interconnection layer 4.

Figure 11:
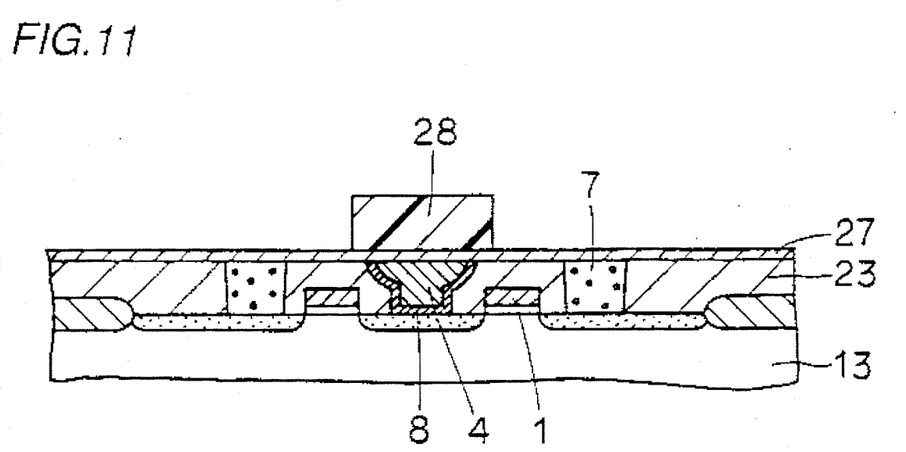
Figure 12:
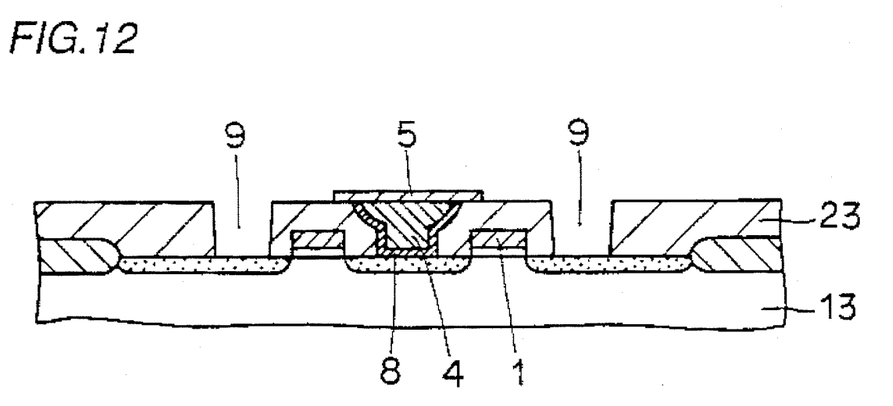

Referring to FIG. 11, resist 28 is formed on second insulating film 27 only above buried bit interconnection layer 4. Referring to FIGS. 11 and 12, second insulating film 27 is patterned using resist 28 as mask, and insulating film 7 is removed. The etching rate of insulating film 7 is higher than that of interlayer insulating film 23, and therefore interlayer insulating film 23 is not etched at the time. Removal of insulating film 7 exposes a surface of the other source/drain region 15b.

Figure 13:
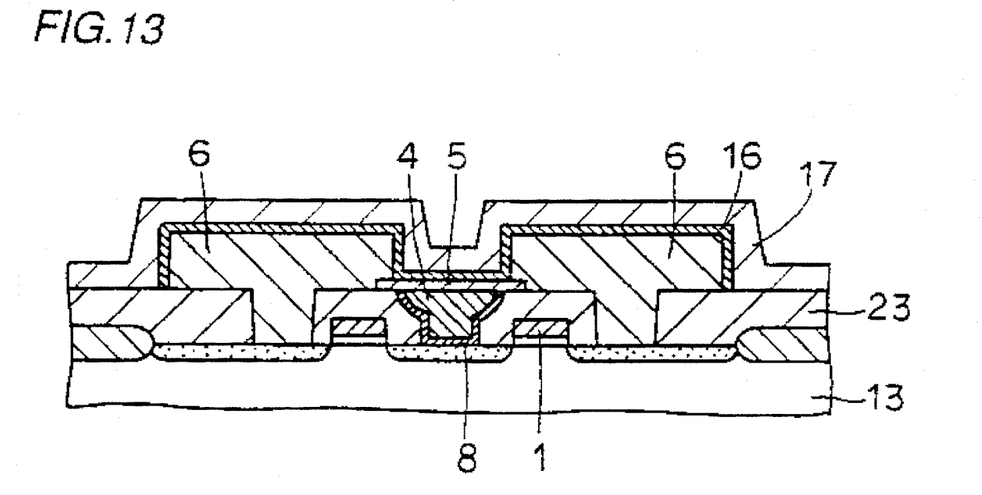

Referring to FIG. 13, a polysilicon film is formed on semiconductor substrate 13 so as to fill second contact hole 9, and the polysilicon film is patterned to form storage node interconnection 6. Then, the surface of storage node interconnection 6 is covered with dielectric film 16. Forming cell plate electrode 17 over storage node interconnection 6 with dielectric film 16 therebetween completes the DRAM.

In this embodiment, referring to FIGS. 3 and 4, opening 10a for forming first contact hole 10 and opening 9a for forming second contact hole are formed in resist film 24 at a time, and therefore the first contact hole and the second contact hole will not be shifted from their originally designed positions. One step of registering a photomask on resist is reduced, and the precision of total registration is improved as compared to conventional methods. As a result, margin in micro lithography is increased. Referring to FIG. 4, since first contact hole 10 and second contact hole 9 are formed at a time, a single interlayer insulating film needs only be formed. Accordingly, the thickness of total interlayer insulating films can be reduced than conventional cases, and thus stepped portions in the device can be reduced.

Embodiment 2

Figure 14:
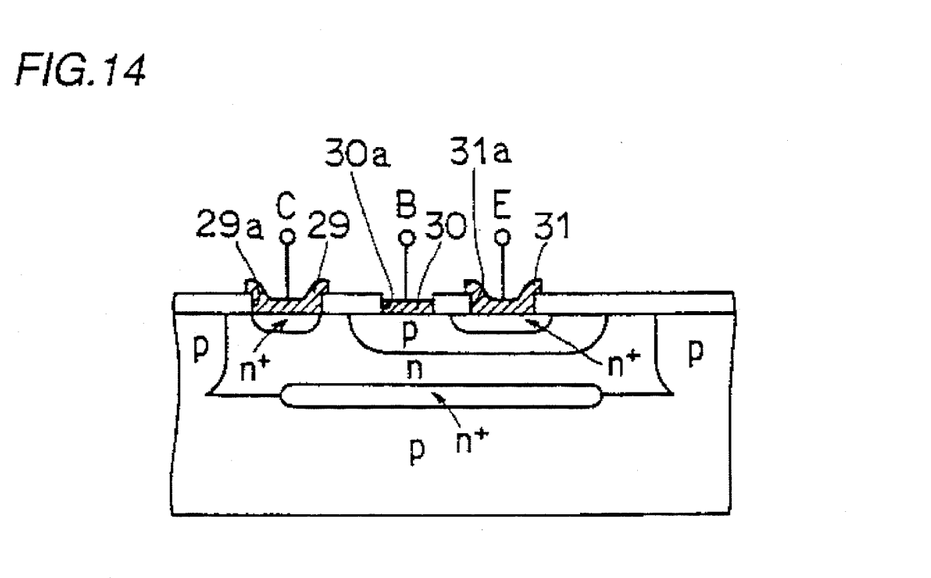
FIG. 14 is a cross sectional view showing a semiconductor device according to Embodiment 2.

In Embodiment 1, the DRAM is described by way of example, but the invention is not limited to such a device, and is applicable to a bipolar transistor as illustrated in FIG. 14.

Referring to FIGS. 1 and 14 in comparison, one storage node interconnection 6 corresponds to a collector electrode, buried bit interconnection layer 4 corresponds to a base electrode 30, and the other storage node interconnection 6 to an emitter electrode 31. Application of the present invention to such a bipolar transistor can reduce the thickness of the interlayer insulating film and therefore stepped portions in the device.

The bipolar transistor as illustrated in FIG. 14 can be formed according to the method shown in FIGS. 2 to 13. As a result, since a contact hole 29a for forming collector electrode 29, a contact hole 30a for forming base electrode 30, and a contact hole 31a for forming emitter electrode 31 are formed at a time, the total registration precision can be improved as compared to conventional methods.

As in the foregoing, in the semiconductor device according to the first aspect of the invention, the position of the surface of the first interconnection layer is the same as or lower than the surface of the interlayer insulating film, and therefore stepped portions in the device can be reduced.

In the semiconductor device according to the second aspect of the invention, the position of the surface of the buried bit interconnection layer is the same as or lower than the surface of the interlayer insulating film, and therefore a DRAM with reduced stepped portions is provided.

By the method of manufacturing the semiconductor device according to the third aspect of the invention, the first contact hole for exposing the surface of the first conductive layer and the second contact hole for exposing the surface of the second conductive layer are formed at a time, and therefore the positions of first contact hole and second contact hole will not be shifted. In addition, one step of registering photomask on resist is reduced, and therefore the total registration precision can be improved as compared to the conventional methods. As a result, margin in micro lithography can be increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate;

a first conductive layer and a second conductive layer formed apart from each other on a surface of said semiconductor substrate, an interlayer insulating film having an upper surface and formed on said semiconductor substrate, a first contact hole for exposing a surface of said first conductive layer being formed in said interlayer insulating film;

a first interconnection layer having an upper surface and filling said first contact hole so as to be in contact with said first conductive layer, the upper surface of said first interconnection layer extending to a height no greater than the upper surface of said interlayer insulating film;

an insulating film covering the upper surface of said first interconnection layer;

a second contact hole formed in said interlayer insulating film for exposing a surface of said second conductive layer; and a second interconnection layer provided on said interlayer insulating film so as to be in contact with said second conductive layer through said second contact hole.

2. A semiconductor device as recited in claim 1, wherein the thickness of said insulating film is at least 0.05 μm.

3. A semiconductor device as recited in claim 1, wherein said semiconductor device includes a bipolar transistor.

4. A semiconductor device, comprising:

a semiconductor substrate;

a gate electrode formed on said semiconductor substrate;

a pair of source/drain layers provided in a surface of said semiconductor substrate on both sides of said gate electrode;

an interlayer insulating film having an upper surface and provided on said semiconductor substrate, covering said gate electrode, a first contact hole for exposing a surface of one of said source/drain layers being provided in said interlayer insulating film;

a buried bit interconnection layer having an upper surface and buried in said first contact hole so as to be electrically connected to said one source/drain layer, the upper surface of said buried bit interconnection layer extending to a height no greater than the upper surface of said interlayer insulating film;

an insulating film covering the upper surface of said buried bit interconnection layer;

a second contact hole provided in said interlayer insulating film for exposing a surface of the other of said source/drain layers;

a storage node interconnection provided on said interlayer insulating film so as to be connected to said the other source/drain layer through said second contact hole;

a dielectric film covering a surface of said storage node interconnection; and a cell place electrode covering said storage node interconnection with said dielectric film therebetween.

* * * * *